United States Patent
Naujok et al.

(10) Patent No.: US 11,500,137 B2
(45) Date of Patent: Nov. 15, 2022

(54) MULTILAYER MIRROR FOR REFLECTING EUV RADIATION AND METHOD FOR PRODUCING THE SAME

(71) Applicant: Fraunhofer-Gesellschaft zur Förderung der angewandten Forschung e.V., Munich (DE)

(72) Inventors: Philipp Naujok, Jena (DE); Sergiy Yulin, Jena (DE); Norbert Kaiser, Jena (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 857 days.

(21) Appl. No.: 16/338,013

(22) PCT Filed: Sep. 25, 2017

(86) PCT No.: PCT/EP2017/074231
§ 371 (c)(1),
(2) Date: Mar. 29, 2019

(87) PCT Pub. No.: WO2018/065251
PCT Pub. Date: Apr. 12, 2018

(65) Prior Publication Data
US 2019/0235141 A1    Aug. 1, 2019

(30) Foreign Application Priority Data
Oct. 6, 2016 (DE) .......... 102016118940.5

(51) Int. Cl.
*G02B 5/08* (2006.01)
*G21K 1/06* (2006.01)
(Continued)

(52) U.S. Cl.
CPC ........ *G02B 5/0891* (2013.01); *C23C 14/0605* (2013.01); *C23C 14/067* (2013.01);
(Continued)

(58) Field of Classification Search
CPC .......... G02B 5/00; G02B 5/08; G02B 5/0816; G02B 5/085; G02B 5/0858; G02B 5/0875;
(Continued)

(56) References Cited

U.S. PATENT DOCUMENTS 8,411,355 B2    4/2013  Tsarfati et al.
8,638,494 B2 *  1/2014  Tsarfati ............... C23C 8/36
                                                         359/359
(Continued)

FOREIGN PATENT DOCUMENTS

DE    102006046000 A1    8/2007
DE    102013210533 A1    12/2014
(Continued)

OTHER PUBLICATIONS

S.S. Andreev, et al., "Multilayered mirrors based on La/B4C(B9C) for X-ray range near anomalous dispersion of boron (^~ 6.7nm)", 2009, Nuclear Instruments and Methods in Physics Research A, 603, pp. 80-82. (Year: 2009).*

(Continued)

*Primary Examiner* — Anastasia Midkiff
(74) *Attorney, Agent, or Firm* — Slater Matsil, LLP

(57) ABSTRACT

A multilayer mirror for reflecting Extreme Ultraviolet (EUV) radiation and a method for producing the same are disclosed. In an embodiment a multilayer mirror includes a layer sequence having a plurality of alternating first layers and second layers, the first layers including lanthanum or a lanthanum compound and the second layers including boron, wherein the second layers are doped with carbon, and (Continued)

wherein a molar fraction of carbon in the second layers is 10% or less.

13 Claims, 3 Drawing Sheets

(51) Int. Cl.

| | | |
|---|---|---|
| *C23C 14/06* | (2006.01) | |
| *C23C 28/00* | (2006.01) | |
| *C23C 14/18* | (2006.01) | |
| *G02B 13/14* | (2006.01) | |
| *C23C 14/35* | (2006.01) | |
| *G03F 7/20* | (2006.01) | |
| *G01N 23/20008* | (2018.01) | |
| *B82Y 30/00* | (2011.01) | |

(52) U.S. Cl.
CPC ............ *C23C 14/185* (2013.01); *C23C 14/35* (2013.01); *C23C 28/42* (2013.01); *C23C 28/44* (2013.01); *G02B 13/143* (2013.01); *G03F 7/70958* (2013.01); *G21K 1/062* (2013.01); *B82Y 30/00* (2013.01); *G01N 23/20008* (2013.01); *G21K 2201/061* (2013.01)

(58) Field of Classification Search
CPC .... G02B 5/0891; G02B 13/14; G02B 13/143; G21K 1/06; G21K 1/062; G21K 2201/00; G21K 2201/06; G21K 2201/061; G21K 2201/067; G21K 2207/00; G03F 7/708; G03F 7/70808; G03F 7/70958; C23C 14/00; C23C 14/02; C23C 14/06; C23C 14/0605; C23C 14/0647; C23C 14/0664; C23C 14/067; C23C 14/14; C23C 14/16; C23C 14/165; C23C 14/18; C23C 14/185; C23C 14/20; C23C 14/205; C23C 14/34; C23C 14/3435; C23C 14/3464; C23C 14/35; C23C 14/352; C23C 14/54; C23C 28/34; C23C 28/341; C23C 28/342; C23C 28/345; C23C 28/40; C23C 28/42; C23C 28/44; G01N 23/20; G01N 23/20008; B82Y 30/00

See application file for complete search history.

(56) References Cited

U.S. PATENT DOCUMENTS

| | | | |
|---|---|---|---|
| 9,082,521 B2 * | 7/2015 | Glushkov | ........... G03F 7/70316 |
| 9,448,492 B2 | 9/2016 | Yakunin et al. | |
| 10,353,120 B2 * | 7/2019 | Kandaka | ................... G03F 1/52 |
| 2011/0194087 A1 | 8/2011 | Tsarfati et al. | |
| 2013/0266739 A1 * | 10/2013 | Lin | ........................ C23C 14/34 |
| | | | 427/535 |

FOREIGN PATENT DOCUMENTS

| | | |
|---|---|---|
| JP | 2011527416 A | 10/2011 |
| JP | 2014523641 A | 9/2014 |

OTHER PUBLICATIONS

H. Werheit, et al., "Structural and Electronic Properties of Carbon-Doped B-Rhombohedral Boron", 1993, Phys. Stat. Sol. (b)179, pp. 489-511. (Year: 1993).*

Kuznetsov, D., et al., "High-reflectance La/B-based multilayer mirror for 6.x nm wavelength," Optics Letters, vol. 40, No. 16, Aug. 7, 2015, pp. 3778-3781.

Miakhotkin, I., et al., "Short period La/B and LaN/B multilayer mirrors for 6.8 nm wavelength," Optics Express, vol. 21, No. 24, Nov. 26, 2013, pp. 1-11.

* cited by examiner

MULTILAYER MIRROR FOR REFLECTING EUV RADIATION AND METHOD FOR PRODUCING THE SAME

This patent application is a national phase filing under section 371 of PCT/EP2017/074231, filed Sep. 25, 2017, which claims the priority of German patent application 102016118940.5, filed Oct. 6, 2016, each of which is incorporated herein by reference in its entirety.

TECHNICAL FIELD

The invention concerns a multilayer mirror provided for the reflection of Extreme Ultraviolet (EUV) radiation in the spectral range between 6 nm and 10 nm and a process for producing the multilayer mirror.

BACKGROUND

In this wavelength range, the wavelength around 6.7 nm is of particular importance because radiation of this wavelength could be used in a next generation of EUV lithography (BEUVL, Beyond Extreme Ultraviolet Lithography).

Multilayer mirrors for the EUV spectral range usually have a periodic layer sequence comprising a large number of thin-film pairs. A thin-film pair generally contains two layers of different materials, which should have as large a difference in optical constants as possible in the wavelength range intended for use of the component. At least one of these materials should have the lowest possible absorption at the intended wavelength. The choice of materials for the layer sequence therefore depends primarily on the wavelength at which the optical component is to be used. In the EUV spectral range there is therefore an optimal material pairing for a certain wavelength range, usually only a few nanometers wide, which guarantees a high reflection due to the optical contrast of the layer materials.

For the realization of optical systems in the EUV spectral range, there is a need for mirrors having the highest possible reflection. This applies in particular to applications in which multiple reflections occur at different mirrors, since the reflection of the entire optical system in this case decreases exponentially with the number of mirrors. In an arrangement of several mirrors, even a slight improvement in the reflection of a single mirror has a considerable influence on the overall reflection of the optical system.

The U.S. Publication No. 2011/0194897 A1 describes multilayer mirrors for the wavelength range from 5 nm to 12 nm which are alternating layer systems consisting of first layers and second layers, the first layers comprising lanthanum or thorium or a nitride or carbide of these materials and the second layers comprising boron (B) or boron carbide ($B_4C$).

DC magnetron sputtering has proven to be the process capable of producing multilayer mirrors which meet the high industrial requirements for EUV lithography, in particular with regard to the reproducibility of the coating and an exact layer thickness distribution. In DC magnetron sputtering, a DC voltage (typically several hundred volts) is applied between a target made of the coating material and the substrate to be coated. The target forms the negative electrode and the substrate the positively charged electrode. By impact ionization of the atoms of the inert gas used (e.g., argon) a plasma (an argon low-pressure plasma) is formed in the gas space, of which the components negatively charged electrons and positively charged gas ions, such as Ar+, are accelerated in the direction of the substrate or the target by the DC voltage applied. Now a permanent current of positive ions hits the target; hence the name of the process direct current sputtering or DC sputtering. On impact with the target, particles are knocked out of the target by impulse transfer and move away from the target in the direction of the substrate, where they are deposited as a thin layer.

In DC magnetron sputtering, an additional magnetic field is generated behind the target. Due to the superposition of electric field and magnetic field, the charge carriers no longer move parallel to the electric field lines, but are deflected onto a spiral path. This extends the path and increases the number of collisions per electron. The effectively higher ionization capacity of the electrons leads to an increase in the number of noble gas ions and thus also in the sputtering rate.

A major disadvantage of this process is that it can only be used for electrically conductive target materials. With electrically insulating materials, both the target and the substrate would be electrically charged by the constant supply of new charge carriers, thus compensating the DC voltage field and hindering the sputtering process, since subsequent ions would be electrically repelled.

While boron carbide ($B_4C$) is excellent for DC sputtering, DC sputtering cannot be used for pure boron due to its much too low electrical conductivity. This means that other, much more complex coating processes have to be used. In the publication I. A. Makhotkin et al., "Short period La/B and LaN/B multilayer mirrors for ~6.8 nm wavelength", Optics Express 21 (24), 2013, p. 29894-299904, it is proposed to heat the boron target to be sputtered to over 400° C., which sufficiently increases its conductivity. However, this is associated with increased effort and can lead to undesired heating of the substrate to be coated. Alternatively, the technique of high frequency sputtering can be used for a non-conductive material, which, however, is much more unstable than DC sputtering and has problems meeting industrial requirements.

SUMMARY OF THE INVENTION

Embodiments provide a multilayer mirror for reflection of EUV radiation in the spectral range between 6 nm and 10 nm, which is characterized by high reflection and can be produced with comparatively little effort, high accuracy and good reproducibility. Further embodiments provide a suitable process for the production of the multilayer mirror.

In various embodiments, the multilayer mirror described here is intended for reflecting EUV radiation in the spectral range between 6 nm and 10 nm, preferably between 6 nm and 7 nm, especially at about 6.7 nm. The multilayer mirror comprises, according to at least one embodiment, a layer sequence with a plurality of alternating first layers and second layers. The first layers comprise lanthanum or a lanthanum compound and the second layers comprise boron. The second layers are advantageously doped with carbon. "Doped with carbon" means in particular that the layer material boron contains foreign atoms of carbon, but the concentration of the carbon atoms is lower than in the binary chemical compound of boron and carbon, i.e., in boron carbide ($B_4C$). In particular, the molar fraction of carbon in the second layers does not exceed 10%. The "molar fraction" is the ratio of the number of carbon atoms to the total number of boron and carbon atoms in the material of the second layers. This dimensionless quantity in the value range between 0 and 1 (i.e., between 0% and 100%) is partly also given in atomic percent (abbreviated at %).

The lower the molar fraction of carbon, the higher the achievable reflectivity. Preferably the molar fraction of carbon in the second layers is only 5% or less, especially preferred only 3% or less. For example, the molar fraction of carbon can be about 2%. In other words, the second layers have $B_{1-x}C_x$ with $x \leq 0.1$, preferred with $x \leq 0.05$ and particularly preferred with $x \leq 0.03$.

It has been found that even a low carbon concentration in the boron layer material compared to boron carbide ($B_4C$) is sufficient to produce sufficient electrical conductivity to enable the second layers to be produced using DC magnetron sputtering. This is advantageous because the layers can be produced by DC magnetron sputtering with high layer thickness precision and very good reproducibility. Compared to multilayer mirrors, which are based on the material combination of a lanthanum compound and boron carbide ($B_4C$), the proposed material combination of lanthanum or a lanthanum compound with carbon-doped boron also achieves a higher reflectivity. The boron layers with the very low carbon content therefore combine the advantages of pure boron layers, which are characterized by a particularly high reflectivity in the material combination with lanthanum or a lanthanum compound, with those of $B_4C$ layers, which can be advantageously produced with DC magnetron sputtering.

The second layers of boron are advantageously doped with carbon over their entire thickness. The foreign atoms of carbon are thus not only present in the interface area of the second layers, but are also distributed over their entire layer thickness. Preferably there is an essentially homogeneous distribution of the foreign carbon atoms in the second layers.

The layer sequence comprises the alternating first layers and second layers. The first layers contain lanthanum or a lanthanum compound such as lanthanum oxide, lanthanum carbide or lanthanum nitride. With these materials for the first layers, high reflectivity can be achieved in combination with the second layers that comprise carbon-doped boron.

The first layers and the second layers of the multilayer mirror preferably each have a layer thickness between about 1 nm and about 3 nm.

The layer sequence preferably comprise of between 100 and 400 layer pairs of one of the first layers and one of the second layers. In the wavelength range from about 6 nm to 10 nm, which is relevant for the multilayer mirror described here, such a high number of layer pairs can advantageously achieve a high reflectivity.

In an advantageous configuration of the multilayer mirror, thin barrier layers containing boron carbide ($B_4C$) or carbon (C) and a thickness of no more than 1.0 nm are arranged at the interfaces between the first layers and the second layers. Barrier layers with a thickness between 0.1 nm and 1.0 nm are preferred. The barrier layers can be advantageous to minimize interdiffusion at interfaces between the first layers and the second layers. An increase in interface width by interdiffusion, especially at high temperatures, could otherwise impair the reflectivity of the multilayer mirror. By inserting the barrier layers between the first layers and the second layers, the thermal stability of the multilayer mirror can thus be improved, especially for use at high operating temperatures, for example, in the vicinity of an EUV radiation source.

The barrier layers can be arranged at all interfaces between the first layers and the second layers, regardless of whether a first layer follows a second layer in the direction of growth or vice versa a second layer follows a first layer. Alternatively, the barrier layers may be inserted either only at the interfaces where a first layer follows a second layer in the direction of growth, or at the interfaces where a second layer follows a first layer in the direction of growth.

In particular, the layer sequence can be a periodic layer sequence in which the layer pairs each have the same thickness (period thickness). The period thickness is the sum of the thicknesses of a first layer and a second layer, plus any barrier layers arranged between the first layers and the second layers. The mirror may be intended in particular for use under almost perpendicular incidence of radiation, in which case the period thickness is approximately half the wavelength. Preferably the period thickness is between about 3 nm and about 4 nm.

In a process for producing the multilayer mirror for the EUV spectral region, first layers comprising lanthanum or a lanthanum compound and second layers comprising boron are deposited alternately, the second layers being doped with carbon, and the molar fraction of carbon in the second layers being 10% or less. In this process, the first and second layers are deposited by DC magnetron sputtering in particular, which provides the above-mentioned advantages of high film thickness accuracy and good reproducibility.

For the deposition of the second layers by DC magnetron sputtering, a sputtering target with boron doped with carbon is advantageously used. The sputtering target has an advantageous amount of carbon which is essentially equal to the amount of carbon in the second layers to be deposited. The amount of carbon in the sputtering target can be 10% or less, preferably 5% or less, preferably 3% or less.

The carbon doping in the second layers may be carried out immediately during the production of the second layers due to the use of a sputtering target containing boron doped with carbon, with the foreign atoms of carbon being distributed throughout the second layers.

Further advantages of the process result from the previous description of the multilayer mirror and vice versa.

BRIEF DESCRIPTION OF THE DRAWINGS

The invention will be explained in more detail in the following using examples in connection with FIGS. 1 to 4.

In the figures.

Same or similarly acting components are provided in the figures with the same reference signs in each case. The represented components as well as the proportions of the components among each other are not to be regarded as true to scale.

DETAILED DESCRIPTION OF ILLUSTRATIVE EMBODIMENTS

Figure 1:
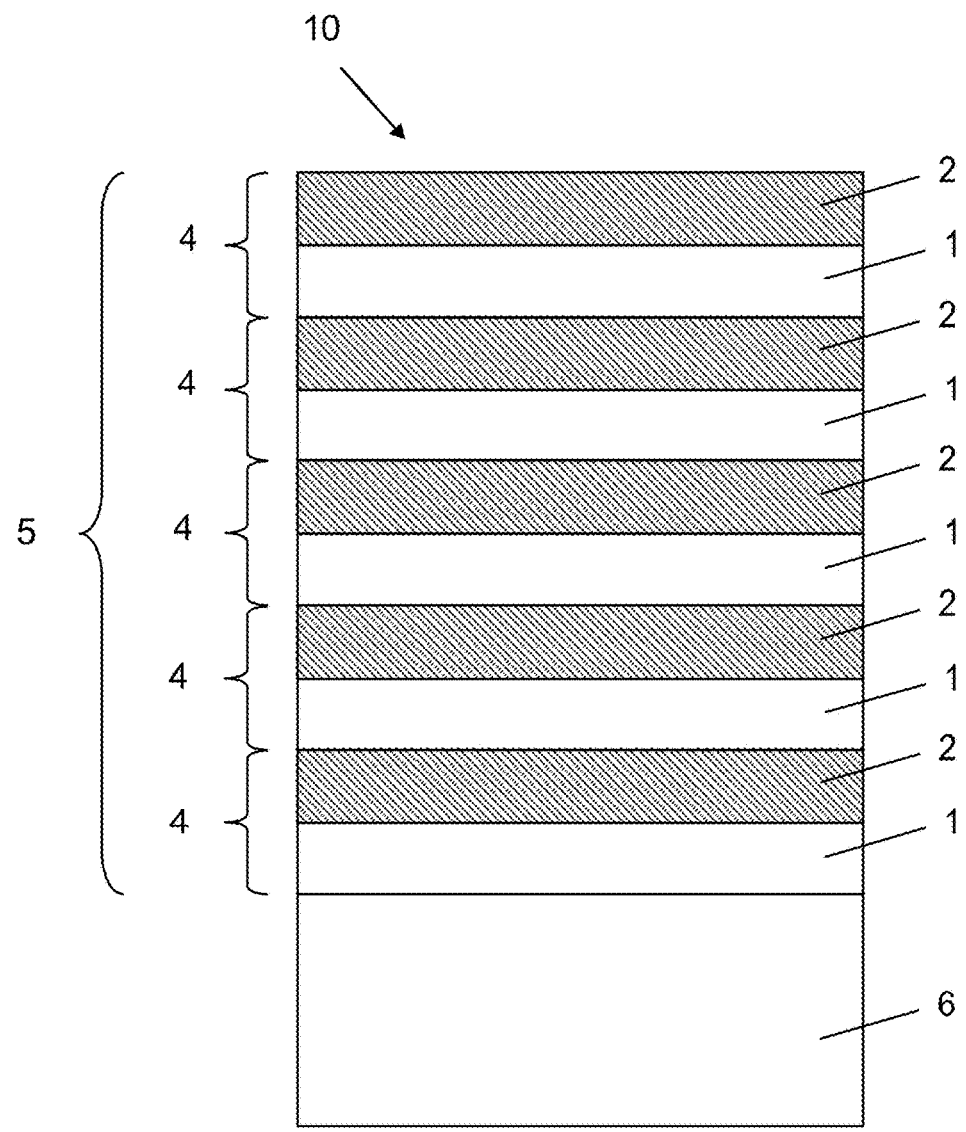
FIG. 1 shows a schematic representation of a multilayer mirror for EUV radiation.

The multilayer mirror 10 for EUV radiation shown schematically in cross-section in FIG. 1 has a layer sequence 5 with a plurality of alternating first layers 1 and second layers 2. The layer sequence 5 is applied to a substrate 6 which, depending on the application, can be a flat substrate or a curved substrate. A substrate 6 with a low surface roughness is preferably used to achieve the highest possible reflectivity. The substrate 6 can, for example, contain silicon or a glass ceramic.

A first layer 1 and a second layer 2 each form a layer pair 4. To simplify the representation, only five layer pairs 4 are shown in FIG. 1, whereby the layer sequence 5 preferably has between about 100 and about 400 layer pairs 4 in order to achieve the highest possible reflection. For example, the multilayer mirror 10 can have about 250 layer pairs 4.

The layer sequence 5 can in particular be a periodic layer sequence in which the layer pairs 4 have the same structure and the same layer thicknesses. In this case, the sum of the thickness of a first layer 1 and a second layer 2 is the period thickness, which is preferably between about 3 nm and about 4 nm. With a multilayer mirror 10 optimized for vertical incident radiation, the period thickness is approximately half the wavelength of the reflection maximum. For a mirror with a reflection maximum at the wavelength $\lambda=6.7$ nm, for example, the period thickness can be about 3.4 nm.

The first layers 1 of the layer pairs 4 comprise or consist of lanthanum (La) or a lanthanum compound. In particular, the first layers may comprise or consist of a lanthanum nitride, a lanthanum oxide or a lanthanum carbide. The second layers 2 of the layer pairs 4 comprise boron (B) and additional carbon (C) in low concentrations. The molar fraction of carbon in the second layer 2 is not more than 10%, preferably not more than 5% and particularly preferably not more than 3%. The addition of carbon to the base material boron increases the electrical conductivity of the second layers 2 and makes it possible to manufacture them advantageously using DC magnetron sputtering. DC magnetron sputtering can be advantageously carried out at room temperature, especially without heating the sputtering target. An undesired heating of the substrate 6 during the coating process can thus be avoided. This results in the advantages that a high accuracy of the layer thicknesses and a good reproducibility are achieved.

Furthermore, the reflectivity of the layer sequence 4 is greater than if boron carbide ($B_4C$) were used for the second layers 2. In order to achieve good electrical conductivity of the second layers 2, it may be advantageous if the carbon molar fraction is at least 0.1%, preferably at least 1% or particularly preferably at least 2%.

It is possible that the multilayer mirror 10 has at least one cover layer (not shown) on the side facing away from the substrate 6, which may have a different material and/or layer thickness than the first layers 1 and second layers 2. Such a cover layer may, for example, be intended to improve the resistance of the multilayer mirror 10 to oxidation and/or incident ions, in particular when used in the vicinity of an EUV radiation source. Suitable cover layer materials are in particular oxides, nitrides or carbides, such as oxides, nitrides or carbides of La, Ce, U or Th.

Figure 2:
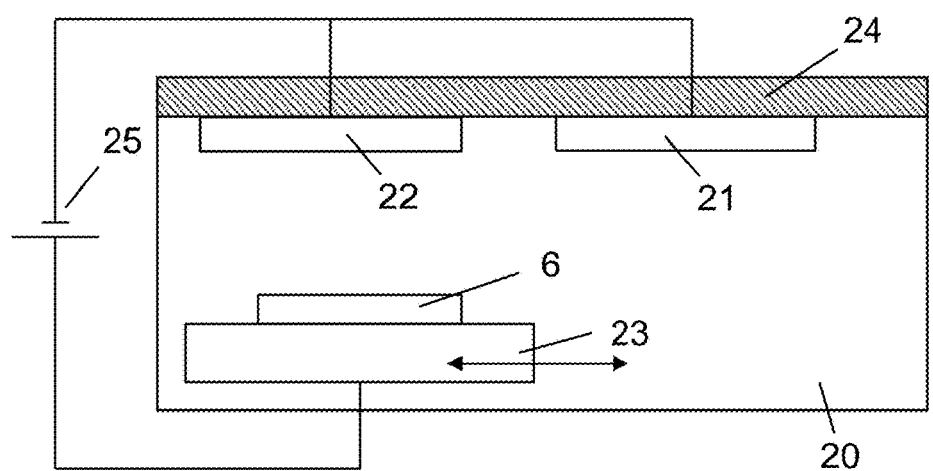
FIG. 2 shows a schematic representation of a process for producing the multilayer mirror for EUV radiation.

In the production of the multilayer mirror 10, the entire layer sequence 5 is preferably deposited by DC magnetron sputtering. FIG. 2 schematically shows the sputtering process in a DC magnetron sputtering system 20. During the deposition process, the substrate 6 is arranged on a substrate holder 23, which is preferably movable in a lateral direction and can thus be moved under different sputtering targets 21, 22 for the deposition of different layer materials. Between the substrate holder 23, which acts as the anode, and the sputtering targets 21, 22, which act as the cathode, a DC voltage 25 is applied during the sputtering process. The DC magnetron sputtering system 20 also has a gas inlet for the sputtering gas, preferably argon, and a high vacuum pump (not shown). A magnetron 24 for generating a magnetic field is arranged above the sputtering targets 21, 22. In addition to the two sputtering targets 21, 22 shown as examples, at least one further sputtering target can be provided, e.g., for the production of barrier layers from a third material.

A sputtering target 22 containing carbon-doped boron is used to apply the second layers 2. The sputtering target 22 may in particular contain boron with a carbon molar fraction of not more than 10%, preferably not more than 5% and particularly preferably not more than 3%. For example, the carbon molar fraction may be 2%.

The foreign atoms of carbon are already introduced into the second layers 2 during production by using the sputtering target 22, which in addition to boron contains the foreign atoms of carbon in the desired amount. In this way, the material carbon is distributed over the entire thickness of the second layer 2. In particular, apart from possible diffusion-related deviations at the interfaces, the molar fraction of carbon in the second layers 2 can be essentially constant.

Figure 3:
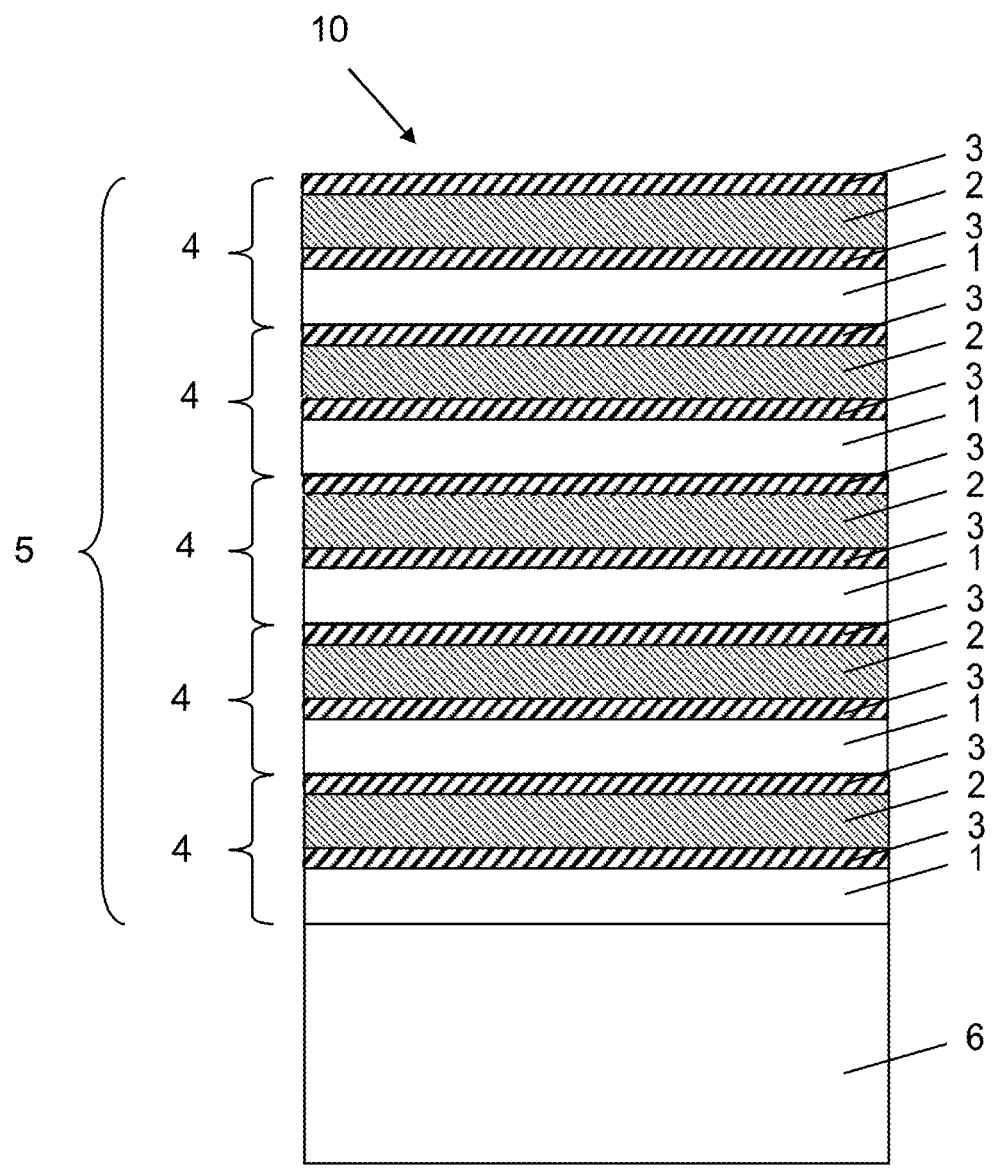
FIG. 3 shows a schematic representation of a multilayer mirror for EUV radiation.

FIG. 3 shows another example of the multilayer mirror 10. This essentially corresponds to the first example, but a thin barrier layer 3 is additionally inserted at the interfaces between the first layers 1 and the second layers 2. In the example in FIG. 3, a barrier layer 3 is inserted at all interfaces, regardless of whether a first layer 1 follows a second layer 2 in the direction of growth or, conversely, a second layer 2 follows a first layer 1 in the direction of growth. In this case, a layer pair 4 in the layer sequence is a pair of a first layer 1 and a second layer 2 including the barrier layers 3 in between. In this example, a period of the multilayer mirror 10 has four sublayers each.

Alternatively, however, it would also be possible for the barrier layers 3 to be arranged at only one of the interfaces where a first layer 1 follows a second layer 2 in the direction of growth, or vice versa. In this case, a period of the multilayer mirror 10 would have three sublayers.

The barrier layers 3 are preferably only between 0.1 nm and 1.0 nm thick. Particularly suitable materials for the barrier layers are carbon (C) and boron carbide ($B_4C$). It has been found that the reflectivity of the multilayer mirror 10 can be further increased by inserting the thin barrier layers 3 between the first layers 1 and the second layers 2. It can be assumed that the insertion of the thin barrier layers results in 3 smoother interfaces in layer sequence 5, which have a positive effect on the reflectivity of layer sequence 5.

Figure 4:
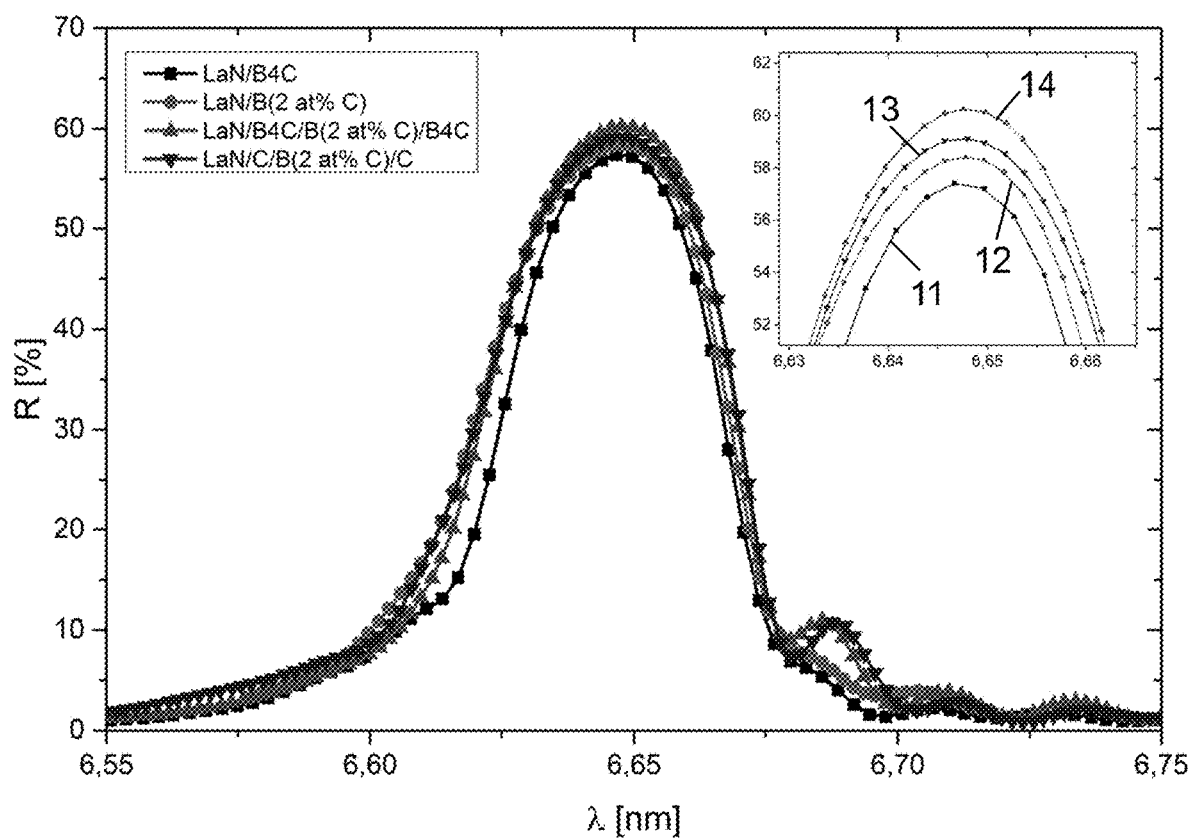
FIG. 4 shows a graphical representation of the reflection of multilayer mirrors for EUV radiation according to three different examples and a comparison example.

FIG. 4 shows the measured reflection R for s-polarized radiation at an angle of incidence of 10° for three examples of multilayer mirrors and a comparison example not in accordance with embodiments of the invention. In the inserted detail magnification, the area around the reflection maximum is enlarged to illustrate the differences in the maximum reflectivity. The measurements were carried out on the EUV reflectometer of PTB Berlin.

The reflection curve 11 shows the measured reflectivity R of a comparative example which does not correspond to embodiments of the invention of a multilayer mirror with 250 layer pairs consisting of alternating first layers of LaN and second layers of $B_4C$ as a function of the wavelength $\lambda$. The maximum reflectivity measured is 57.8%. The reflection curve 12 shows the measured reflectivity of an example of a multilayer mirror with 250 layer pairs consisting of alternating first layers of LaN and second layers of boron doped with carbon, where the mass fraction of carbon is 2%. It can be seen that the measured reflectivity of 58.4% is higher than in the comparison example of the reflection curve 11.

The reflection curve 13 shows the measured reflectivity of another example of a multilayer mirror with 250 layer pairs which have alternating first layers of LaN and second layers of boron doped with carbon, where the amount of carbon is 2%. In this example, barrier layers of carbon (C) are additionally inserted at all interfaces between the first layers and the second layers. With 59.1%, the measured reflectivity at the maximum is even greater than in the example of the reflection curve 12.

The reflection curve 14 shows the measured reflectivity of another example of a multilayer mirror with 250 layer pairs, which have alternating first layers of LaN and second layers of boron doped with carbon, whereby the amount of carbon is 2%. In this example, barrier layers of boron carbide ($B_4C$) are additionally inserted at all interfaces between the first layers and the second layers. With 60.6%, the measured reflectivity at the maximum is even greater than in the example of curve 13.

The invention is not limited by the description of the examples. Rather, the invention includes each new feature as well as each combination of features, which in particular includes each combination of features in the patent claims, even if that feature or combination itself is not explicitly stated in the claims or examples.

The research work that led to these results was funded within the framework of the internal programs of the Fraunhofer-Gesellschaft.

The invention claimed is:

1. A multilayer mirror for Extreme Ultraviolet (EUV) radiation comprising:
   a layer sequence having a plurality of alternating first layers and second layers, the first layers comprising lanthanum or a lanthanum compound and the second layers comprising boron,
   wherein the second layers are doped with carbon, and
   wherein a molar fraction of carbon in the second layers is 10% or less.

2. The multilayer mirror according to claim 1, wherein the molar fraction of carbon in the second layers is 5% or less.

3. The multilayer mirror according to claim 1, wherein the molar fraction of carbon in the second layers is 3% or less.

4. The multilayer mirror according to claim 1, wherein the lanthanum compound is a lanthanum nitride, a lanthanum oxide or a lanthanum carbide.

5. The multilayer mirror according to claim 1, wherein the first layers and the second layers each have a thickness between 1 nm and 3 nm.

6. The multilayer mirror according to claim 1, further comprising thin barrier layers arranged at interfaces between the first layers and the second layers, wherein the thin barrier layers comprise $B_4C$ or C and have a thickness of not more than 1.0 nm.

7. The multilayer mirror according to claim 1, wherein the layer sequence is a periodic layer sequence, wherein a period comprises a layer pair of one of the plurality of first layers and one of the plurality of second layers, and wherein the period has a thickness in a range from 3 nm to 4 nm.

8. The multilayer mirror according to claim 1, wherein the layer sequence comprises between 100 and 400 layer pairs, each layer pairs having one of the first layers and one of the second layers.

9. A method for producing a multilayer mirror for an Extreme Ultraviolet (EUV) spectral range, the method comprising:
   alternately depositing first layers comprising lanthanum or a lanthanum compound and second layers comprising boron, wherein the second layers are doped with carbon, and wherein a molar fraction of carbon in the second layers is 10% or less.

10. The method according to claim 9, wherein depositing the first and second layers comprises DC magnetron sputtering the first layers and the second layers.

11. The method according to claim 10, wherein the DC magnetron sputtering uses a sputtering target comprising carbon-doped boron for sputtering the second layers.

12. The method according to claim 11, wherein the carbon in the sputtering target has a molar fraction of 10% or less.

13. The method according to claim 10, wherein the DC magnetron sputtering is performed at room temperature.

\* \* \* \* \*